United States Patent [19]

Le Garrec et al.

[11] Patent Number: 6,091,746
[45] Date of Patent: Jul. 18, 2000

[54] ASSEMBLY OF COOLED LASER DIODE ARRAYS

[75] Inventors: Bruno Le Garrec; Gérard Raze, both of Les Ulis, France

[73] Assignees: Commissariat a l'Energie Atomique, Paris; Compagnie Generale des Matieres Nucleaires, Velizy-Villacoublay, both of France

[21] Appl. No.: 09/068,478

[22] PCT Filed: Nov. 8, 1996

[86] PCT No.: PCT/FR96/01772

§ 371 Date: May 13, 1998

§ 102(e) Date: May 13, 1998

[87] PCT Pub. No.: WO97/18606

PCT Pub. Date: May 22, 1997

[30] Foreign Application Priority Data

Nov. 13, 1995 [FR] France .................................. 95 13400

[51] Int. Cl.$^7$ .............................. H10S 3/04; H10S 3/091
[52] U.S. Cl. ................................. 372/35; 372/35; 372/36; 372/75; 257/714; 257/715; 257/716
[58] Field of Search .................................. 372/35, 36, 75; 257/714, 715, 716

[56] References Cited

U.S. PATENT DOCUMENTS

| 4,315,225 | 2/1982 | Meyer et al. . |
| 5,031,184 | 7/1991 | Greve et al. . |
| 5,105,429 | 4/1992 | Mundinger et al. . |
| 5,105,430 | 4/1992 | Mundinger et al. . |
| 5,317,585 | 5/1994 | Gregor ...................................... 372/35 |
| 5,394,427 | 2/1995 | McMinn et al. .......................... 372/70 |

*Primary Examiner*—Frank G. Font
*Assistant Examiner*—Delma R. Flores Ruiz
*Attorney, Agent, or Firm*—Oblon, Spivak, McClelland, Maier & Neustadt, P.C.

[57] ABSTRACT

An assembly of N laser diode arrays. Each diode is fitted to the end of a base which forms the anode and is traversed by a hole. The holes of all the bases define a channel for the circulation of fluid for cooling the assembly of diode arrays. Each module includes an array, a base and a corresponding cathode. The modules are separated from each other by a flat joint or gasket.

4 Claims, 1 Drawing Sheet

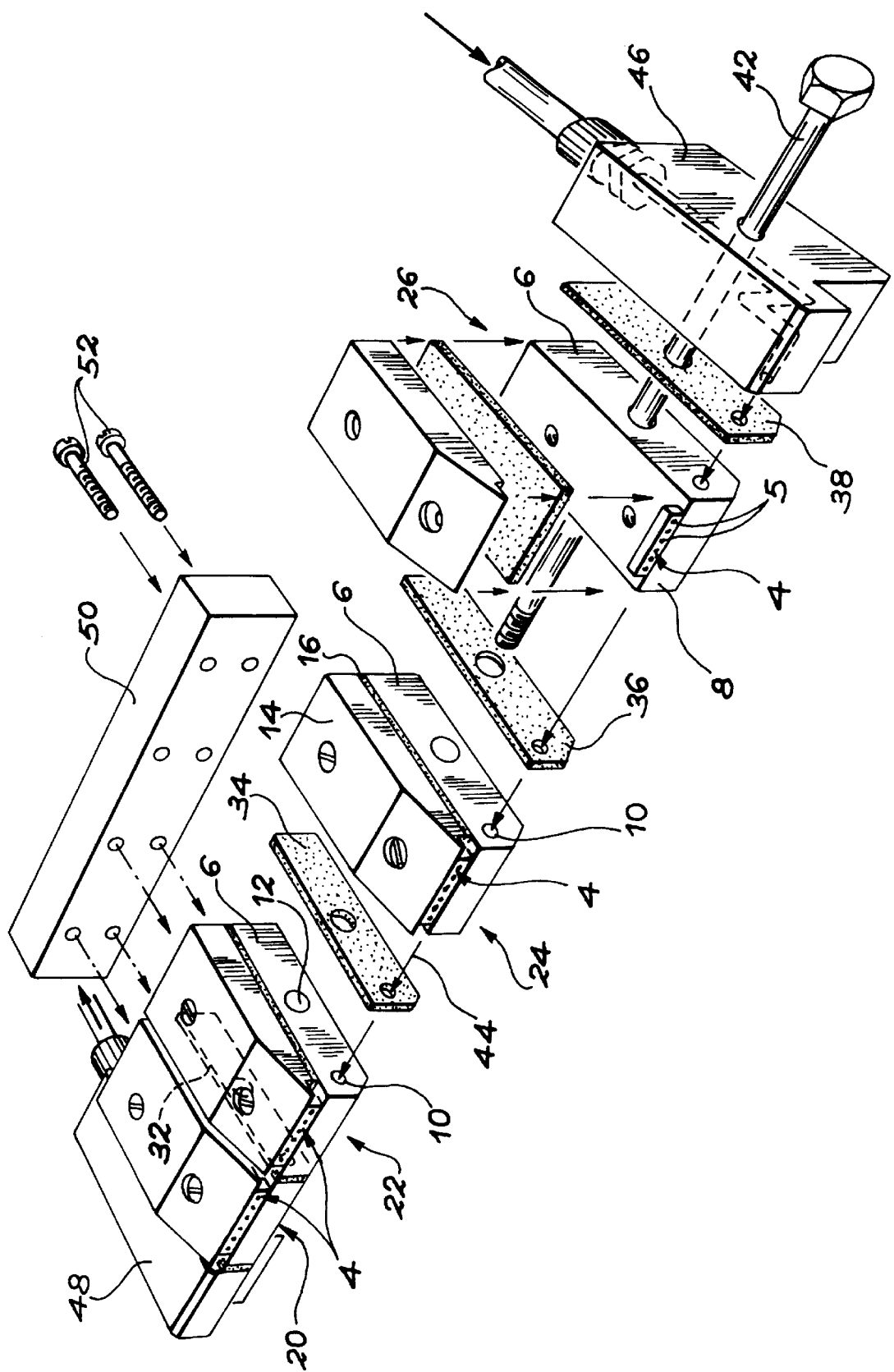

ASSEMBLY OF COOLED LASER DIODE ARRAYS

BACKGROUND OF THE INVENTION

1. Field of the Invention

The invention relates to the field of assemblies of laser diode arrays and their cooling systems.

The fields of application of assemblies of laser diode arrays are numerous and can be grouped into two major families:

applications where the laser radiation of the diodes is used directly (beams shaped by optics or carried by fibres) and essentially relating to the medical sector and the industrial sector (marking);

applications where the laser radiation of the diodes is used for the optical pumping of laser media (energy storage media or nonlinear effect media), e.g. the optical pumping of crystalline materials, such as oxides or fluorides doped with ions of rare earths (Nd, Er, Tm, Ho, Yb, Pr, Ce, . . . ) or Cr, Co and similar ions, optical pumping of laser material, such as dyes and the interaction with nonlinear effect media (generation of harmonics, parametric amplifiers or oscillators).

2. Discussion of the Background

Laser diode arrays and in more general terms laser diodes, have an optical/electrical efficiency of approximately 25 to 33%. Consequently the power lost by heating represents 66 to 75% of the consumed electrical power. In a continuous 20 Watt array, the active volume (semiconductor) is generally very small (micrometric dimensions) and typically 0.5 to 1 $mm^3$, whilst the thermal power density is between 60 and 160 $kW/cm^3$. The array is generally welded to a base (made from brass or copper), which has several functions:

a rigid, mechanical support function, an electrical function (anode), a thermal function, due to a high thermal conductivity.

In all commercial laser diode arrays, heat conduction takes place from the bottom, through the substrate and in general the anode base. This base must be in contact with a cold source in order to remove the thermal power and limit the temperature rise in the semiconductor. The connection in the upper part (cathode) cannot generally ensure an adequate thermal conductivity and the heat exchange takes place by natural convection of the ambient air.

In order to create a cold source, it is either possible to use a metal (brass or copper) cold box, or a Peltier effect thermocouple.

These procedures assume a good contact between the base of the array and the cold source, in order to minimize the contact thermal resistivity. The Peltier effect technology is very widely used in low power applications and when there is only a limited number of diodes. There is no example of the use of this technology for continuous power arrays (typically 21 Watt on average).

A so-called "microchannel" technology is described in U.S. Pat. No. 5,105,429 and U.S. Pat. No. 5,105,430. This technology is based on the assembly of modules in order to form a bidimensional emitting structure, each module having a diode array placed on a substrate with microchannel cooling.

Improvements or variants have been made, relating to the internal architecture of the structure, the construction of the stacks or the way in which the cooling fluid circulates. The principle of cooling by a microchannel structure remains the same, there being the benefit of a large exchange surface (radiator) by having a network of fins in a conductive material. The material can be the actual semiconductor or a material having a good heat conduction, such as silicon, copper or diamond.

The microchannel radiator can be integrated into each array base in order to have an autonomous module, or can be common to assemblies of arrays (surface of bidimensional assembly).

The field of application of microchannel technology is that of stacks of arrays. 1 cm wide or wider array stacks make it possible to obtain emissive areas of several square centimeters. This is the most widely used alternative in connection with surface emission diode networks. For the reasons indicated below, the development of the microchannel method is very delicate.

Firstly, this microchannel method is only accessible by highly sophisticated etching technologies. The size of the channels is also approximately 100 microns, with a spacing of 50 to 150 microns. Therefore the cooling liquid must be filtered with great care so as not to clog the network of microchannels. This leads to a significant pressure loss which, for reasonable fluid flow rates of approximately one liter per minute, assume high pressures (exceeding 4 bars).

Finally, in the case of optical pumping, the known stacks of microchannel arrays do not make it possible to pump media, e.g. having a cylindrical shape. A more conventional technology consists of assembling the arrays in stack form and cooling them from the rear in contact with a water box. This technology can only be envisaged for quasi-continuous emission arrays, i.e. for average powers of 1 to 4 Watts and remains the solution proposed on commercial products.

U.S. Pat. No. 5,031,184 describes a semiconductor pumping diode cooling device. This device has a complex structure, because it involves an assembly on Peltier elements, which themselves rest on a base.

No information is given concerning the assembly of the system and particularly the retention of the parts and joints with respect to the base.

In such a device, it would appear to be difficult to be able to guarantee the sealing and mechanical strength of the system, particularly as a positioning from below and the two sides is difficult to implement. Moreover, thermal expansions may give rise to mechanical stresses which are difficult to contain within such an assembly.

From the thermal standpoint, it would appear to be very difficult with the device of U.S. Pat. No. 5,031,184 to finally regulate the temperature of the semiconductors by means of Peltier elements, when the latter are sandwiched between two water cooling systems, whose function is to ensure a good heat removal due to a good heat exchange coefficient. Although this principle may be usable for a single element it cannot be used for two elements, because the effect of the first Peltier element would have a consequence on the second element, making the second Peltier element compensate the defect, giving rise to the same consequences on the third element and so on.

SUMMARY OF THE INVENTION

The object of the invention is to propose a linear, modular assembly of laser diode arrays integrating the cooling system necessary on the one hand for the removal of the thermal power dissipated by the arrays, and on the other for thermostatting the emitters, i.e. the stability of the emission wavelength of the diodes.

Therefore, the invention relates to an assembly of N laser diode arrays, characterized in that:

each diode is assembled on the end of a base forming an anode and traversed by a hole, all the holes defining a channel for the circulation of a fluid for cooling the linear assembly of diode arrays, each module, constituted by an array, the base and a cathode, being separated from each immediately adjacent module by a flat joint, each base being provided with a second hole, all the second holes being aligned when the arrays are juxtaposed in the operating position, two holding flanges are placed at the ends of the linear assembly of arrays, said flanges being tightened by a screw, which passes through the assembly through all the second holes.

This device permits an optimum integration of the mechanical and thermal functions.

Thus, according to the invention, it is possible to ensure a linear assembly of laser diodes and simultaneously a direct cooling of the base making it possible to reduce the thermal resistance of the assembly. The cooling on the one hand makes it possible to evacuate the thermal power dissipated by the arrays and on the other to stabilize the emission wavelength of the diodes. The presence of a flat joint or gasket between two immediately adjacent modules ensures the cooling fluid sealing, but also the electrical independence of the modules.

Such a linear assembly or device permits the pumping of laser media having an elongated or cylindrical shape.

Two holding or retaining flanges are placed at the ends of the linear assembly of arrays and fixing means (all the second holes and screw) make it possible to ensure the necessary mechanical strength, the screw permitting the tightening of the flanges. Said screw traverses the assembly and can be peripherally covered with an insulating sheath.

Electrical connection means can be provided for supplying the diode arrays.

A series supply can e.g. be provided, in which the anode associated with each array is connected to the cathode of a neighbouring array.

BRIEF DESCRIPTION OF THE DRAWINGS

The features and advantages of the invention can be gathered from the following description. This description relates to illustrative and non-limitative embodiments and refers to the single drawing attached, which shows an assembly of diode arrays according to the invention.

DESCRIPTION OF THE PREFERRED EMBODIMENTS

The single drawing illustrates and embodiment of a linear, modular assembly of laser diode arrays integrating the cooling system. The assembly is obtained from identical parts (unitary module), which are assembled in juxtaposed manner (linear assembly).

Each laser diode array 4 (typical dimensions: width 1 cm, depth 0.5 to 0.6 mm, height 0.1 to 0.2 mm) is welded to a base 6, which is in the present case an anode base, whose width slightly exceeds that of the array. The base is made from metal, e.g. copper or brass and is optionally covered by electrolytic deposition with a gold and nickel coating permitting welding by brazing. The emission from each array takes place at the junctions (between semiconductors) 5, assembled in groups and whose dimensions are a few micrometers or a few dozen micrometers.

The array 4 is fitted to one of the ends 8 of the base 6, which has two holes 10, 12 completely passing through it in its width direction. The first hole 10 is positioned as close as possible to the location of the array 4, so as to ensure a good heat exchange between the array and the cooling fluid and is used for the circulation of the latter. Said first hole 10 e.g. has a diameter of 2 mm and is positioned at less than 2.5 mm from the array 4, which ensures a good heat exchange. The heat exchange is of the forced convection type, by turbulent mode fluid. The diameter of the hole 10 and the fluid flow rate are preferably determined in such a way as to optimize the pressure losses. Preferably, the fluid is circulated so as to optimize the pressure losses.

The second hole 12, e.g. with a diameter of 5.2 mm and in a central position, permits the passage of a screw holding together the modules.

With each anode 6 corresponds a cathode 14 and an insulator 16, positioned between the cathode and the anode.

In the drawing identical unitary modules 20, 22, 24, 26 are linearly juxtaposed. Each module is separated from each neighbouring module by a joint 32, 34, 36, 38. In each joint, holes corresponding to the holes 10, 12, made in each base, give a free passage for the circulation of a cooling fluid and for fixing means 42, which ensure the holding of the assembly. The electrical insulation between neighbouring cathodes is obtained in that the cathodes are narrower than the anodes.

The joints ensure on the one hand the mutual electrical insulation of the arrays and on the other, the sealing of the assembly with respect to the cooling fluid, whose circulation is designated in the drawing by arrow 44.

The fluid traverses all the unitary modules in the same way, the assembly automatically ensuring the circulation of the fluid through the succession of bases and joints.

The assembly is held by its ends using two flanges 46, 48, which serve as an inlet and outlet connection for the cooling fluid. These two flanges are kept integral with the assembly by fixing means 42, which hold together the modules. In the embodiment given, the flanges are tightened by a screw 42, which traverses the assembly. Said screw is peripherally covered with an insulating sheath, in order to ensure the mutual electrical insulation of the modules.

In the linear assembly according to the invention, the diode arrays can be supplied electrically independently of one another.

Therefore different types of electrical connections can be envisaged, in particular a series-type supply where the anode of each array (base) is connected to the cathode of its neighbour. No matter which solution is retained, it can be implemented by means of a connector 50 fitted on the rear face of the assembly. This connector can be made from an insulating material (e.g. Delrin or Lucoflex), to which are connected metal connectors with dimensions and shape adapted to the desired assembly and to the current carried. The electrical connection takes place by means of metal screws 52 in the anode and cathode parts, through the insulating block.

The device described ensures the effective cooling of the continuous power arrays, by means of a low thermal resistivity, e.g. approximately 0.7° C./W, for a water flow rate of approximately 1 liter/minute.

It is also autonomous, because it ensures the mechanical assembly with one another of the arrays without any need for a supplementary support.

Finally, said device has the advantage of being modular and permits the assembly of a number of unitary modules, e.g. between one and about ten.

What is claimed is:

1. Assembly of N laser diode arrays, wherein each diode is assembled on the end of a base forming an anode and traversed by a hole, all the holes defining a channel for the circulation of a fluid for cooling the linear assembly of diode arrays, each module, constituted by an array, the base and a cathode, being separated from each immediately adjacent module by a flat joint, each base being provided with a second hole, all the second holes being aligned when the arrays are juxtaposed in the operating position, two holding flanges are placed at the ends of the linear assembly of arrays, said flanges being tightened by a screw, which passes through the assembly through all the second holes.

2. Assembly according to claim 1, the screw being peripherally covered by an insulating sheath.

3. Assembly according to claim 1, having electrical means for the supply of the diode arrays.

4. Assembly according to claim 1, the anode associated with each array being connected to the cathode of a neighbouring array.

* * * * *